US012782419B2

(12) United States Patent
Ramian et al.

(10) Patent No.: US 12,782,419 B2
(45) Date of Patent: Nov. 3, 2026

(54) TEST AND/OR MEASUREMENT SYSTEM FOR ACCESSING PERFORMANCE OF A DEVICE

(71) Applicant: Rohde & Schwarz GmbH & Co. KG, Munich (DE)

(72) Inventors: Florian Ramian, Munich (DE); Andreas Lagler, Munich (DE); Mike Leffel, Columbia, MD (US); Florian Schlembach, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 221 days.

(21) Appl. No.: 18/680,086

(22) Filed: May 31, 2024

(65) Prior Publication Data

US 2025/0370028 A1 Dec. 4, 2025

(51) Int. Cl.
*G01R 27/32* (2006.01)
*G01R 31/28* (2006.01)

(52) U.S. Cl.
CPC ......... *G01R 31/2822* (2013.01); *G01R 27/32* (2013.01); *G01R 31/2837* (2013.01)

(58) Field of Classification Search
CPC .. G01R 31/2837; G01R 35/005; G01R 27/32; G01R 31/2822; G06F 11/3452; G06F 11/3476; G06F 2201/86; H03G 3/001; H04B 17/0085; H04B 17/29
See application file for complete search history.

(56) References Cited

U.S. PATENT DOCUMENTS

| | | | | |
|---|---|---|---|---|
| 6,529,844 | B1 * | 3/2003 | Kapetanic | H03L 7/22 324/613 |
| 8,155,904 | B2 * | 4/2012 | Dvorak | H04B 17/21 702/66 |
| 9,188,617 | B2 * | 11/2015 | Wertz | G01R 31/2646 |
| 9,210,598 | B1 * | 12/2015 | Bradley | G01R 23/20 |
| 9,595,986 | B2 | 3/2017 | Dunsmore | |
| 11,474,141 | B1 | 10/2022 | Wei et al. | |
| 2016/0103197 | A1 | 4/2016 | Schultz et al. | |
| 2019/0081822 | A1 | 3/2019 | Simpson et al. | |
| 2021/0341526 | A1 | 11/2021 | Dunsmore et al. | |
| 2022/0357379 | A1 | 11/2022 | Fastner et al. | |

FOREIGN PATENT DOCUMENTS

| | | | | |
|---|---|---|---|---|
| DE | 10251551 | A1 | 5/2004 | |
| DE | 102012006195 | A1 * | 10/2013 | G01R 35/005 |

* cited by examiner

*Primary Examiner* — Vinh P Nguyen
(74) *Attorney, Agent, or Firm* — CHRISTENSEN O'CONNOR JOHNSON KINDNESS PLLC

(57) ABSTRACT

A test and/or measurement system includes a signal generator module is configured to generate a modulated radio frequency (RF) signal based on a predetermined waveform. The system further includes a signal analysis module is configured to receive an analysis signal via at least one signal path, and wherein the analysis signal corresponds to the modulated RF signal. The analysis signal includes at least one wanted signal portion and at least one unwanted signal portion. The unwanted signal portion corresponds to a spurious signal originating in the due to signal leakage and/or due to reflections. The signal analysis module is configured to identify the unwanted signal portion in the analysis signal based on the predetermined waveform. The signal analysis module further is configured to analyze the analysis signal taking the identified unwanted signal portion into account, thereby obtaining analysis data.

15 Claims, 2 Drawing Sheets

TEST AND/OR MEASUREMENT SYSTEM FOR ACCESSING PERFORMANCE OF A DEVICE

FIELD OF THE DISCLOSURE

The present disclosure generally relates to a test and/or measurement system.

BACKGROUND

Many different types of measurements performed on electronic devices under test involve generating a radio frequency (RF) signal that is applied to the device under test, and measuring a measurement signal corresponding to the generated RF signal.

With requirements on the accuracy of such measurements becoming higher and higher, and with ever more other potential disturbances such as impedance mismatches being accounted for in modern test and/or measurement systems, the influence of unwanted leakages and reflections within the test and/or measurement system can become a leading contribution to measurement uncertainties or measurement errors.

SUMMARY

Examples of a test and/or measurement system are disclosed that exhibit reduced measurement uncertainties and measurement errors due to leakages and reflections within the test and/or measurement system.

According to aspects of the disclosure, a test and/or measurement system exhibit these beneficial characteristics. In an embodiment, the test and/or measurement system comprises a signal generator module having circuitry configured to generate a modulated radio frequency (RF) signal based on a predetermined waveform. The test and/or measurement system also comprises a signal analysis module having circuitry configured to receive, via at least one signal path, an analysis signal that corresponds to the modulated RF signal.

The analysis signal comprises at least one wanted signal portion, wherein the at least one wanted signal portion is a portion of the analysis signal to be analyzed. The analysis signal further comprises at least one unwanted signal portion, wherein the at least one unwanted signal portion corresponds to a spurious signal originating in the test and/or measurement system due to signal leakage and/or due to reflections.

In an embodiment, the signal analysis module includes circuitry configured to identify the at least one unwanted signal portion in the analysis signal based on the predetermined waveform. The circuitry of the signal analysis module further is configured to analyze the analysis signal taking the identified at least one unwanted signal portion into account, thereby obtaining analysis data.

The term "modulated RF signal" is understood to denote an RF signal whose amplitude, frequency, and/or phase are/is varied over time. In the context of the present disclosure, e.g. a burst of a continuous wave signal having only a predefined duration, namely a duration that is short compared to the time necessary for the RF signal to travel through the test and/or measurement system, is considered to be a modulated signal. In an embodiment, the modulated RF signal may be bandwidth-limited. In another embodiment, the modulated RF signal is not bandwidth-limited.

The term "the analysis signal corresponds to the modulated RF signal" is understood to denote that the analysis signal is obtained based on the modulated RF signal, such that the analysis signal has the same modulation as the modulated RF signal. For example, the analysis signal may be the modulated RF signal processed by a device under test or the modulated RF signal reflected at the device under test, albeit with at least one additional, unwanted signal portion. The analysis signal may have an amplitude that is different from the amplitude of the modulated RF signal.

The term "predetermined waveform" is understood to denote a digital waveform having known properties.

In an embodiment, the predetermined waveform may be adaptable. For example, the predetermined waveform may be adapted automatically to be suitable for testing a particular device under test. Alternatively or additionally, a user may adapt the predetermined waveform by providing a corresponding user input.

In an embodiment, the predetermined waveform may be played back by the signal generator module, i.e. the signal generator module converts the predetermined waveform into the modulated RF signal having a certain signal level.

In general, the predetermined waveform may be suitable for performing tests on the device under test. Thus, the modulated RF signal comprising the predetermined waveform may be applied to the device under test, for example via an output signal path of the test and/or measurement system.

Alternatively or additionally, the predetermined waveform may be suitable for performing a calibration of the test and/or measurement system. Thus, the modulated RF signal comprising the predetermined waveform may be applied to at least one calibration standard, for example via an output signal path of the test and/or measurement system.

The test and/or measurement system according to embodiments of the present disclosure is based on the idea to separate the at least one wanted signal portion from the at least one unwanted signal portion based on a priori knowledge about the predefined waveform.

In general, both the at least one wanted signal portion and the at least one unwanted signal portion originating due to signal leakage and/or reflections have the same or at least a similar overall shape, but in general different amplitudes, phases, and/or group delays for reaching the signal analysis module.

Due to the same or similar overall shape, the wanted and unwanted signal portions can be identified in the analysis signal. Based on the differences described above, the at least one wanted signal portion can be separated from the at least one unwanted signal portion. In an embodiment, it has turned out that the wanted signal portions and the unwanted signal portions can be separated reliably as long as they do not overlap fully in time domain, but at most partially.

Accordingly, the unwanted signal portion(s) can be taken into account for analyzing the analysis signal, such that the measurement accuracy is increased significantly. In other words, measurement uncertainties and measurement errors due to signal leakages and unwanted reflections within the test and/or measurement system are reduced significantly.

Further, when calibrating the test and/or measurement system according to the present disclosure, the influence of spurious signals originating due to unwanted signal leakages and/or unwanted reflections can be compensated, such that the calibration of the test and/or measurement system according to the present disclosure can be performed with enhanced accuracy.

In an embodiment, the unwanted signal portion(s) may be subtracted from the analysis signal, and the analysis data may be obtained based on the resulting corrected analysis signal. Alternatively or additionally, the analysis data may be obtained based on the analysis signal, and the analysis data may be corrected for the at least one identified unwanted signal portion.

As will be described in more detail hereinafter, the at least one unwanted signal portion may originate due to a leakage of at least one directive element such as at least one directional coupler of the test and/or measurement system. Alternatively or additionally, the at least one unwanted signal portion may originate due to unwanted reflections, such as unwanted reflections at ports and/or or other components of the test and/or measurement system. In an embodiment, the at least one unwanted signal portion may originate due to unwanted multi-reflections, wherein the modulated RF signal travels through a certain signal path multiple times.

In an embodiment, the test and/or measurement system may comprise at least one directive element, wherein the at least one unwanted signal portion comprises a leaked signal that is leaked by the at least one directive element. In general, real directive elements have a non-perfect directivity, which may lead to a portion of the modulated RF signal being unwantedly leaked. In an embodiment, the test and/or measurement system is configured to account for such unwanted leakages, thereby enhancing a measurement accuracy and/or a calibration accuracy significantly.

For example, the at least one directive element may be a directional coupler. As another example, the at least one directive element may be a power combiner, a splitter, or a multiplexer.

In an embodiment, the at least one directive element may be interconnected between the signal generator module and a device under test or a calibration standard. The at least one directive element may be configured to forward the modulated RF signal to the device under test or to the calibration standard, and to forward a reflected signal that is reflected at the device under test or at the calibration standard to the analysis module, wherein the reflected signal is a measurement signal to be analyzed. Due to an imperfect directivity of the at least one directive element, a portion of the modulated RF signal may be leaked to the signal analysis module.

According to an aspect of the present disclosure, the signal analysis module, for example, includes circuitry configured to determine a metric based on the analysis signal and based on the predetermined waveform, wherein the metric describes the at least one unwanted signal portion. In other words, the determined metric comprises information on the at least one unwanted signal portion, which can be used in order to separate the at least one wanted signal portion from the at least one unwanted signal portion.

In an embodiment, the metric determined may describe the number of unwanted signal portions, a group delay of the respective unwanted signal portion(s), a phase of the respective unwanted signal portion, and/or an amplitude or a signal level of the respective unwanted signal portion(s).

In an embodiment, the metric may also describe the at least one wanted signal portion, for example a group delay of the at least one wanted signal portion, an amplitude of the at least one wanted signal portion, and/or a phase of the at least one wanted signal portion.

For example, the metric may be or comprise an impulse response of the test and/or measurement system, more precisely an impulse response of a portion of the test and/or measurement system between the signal generator module and the signal analysis module.

In an embodiment of the present disclosure, the signal analysis module includes circuitry configured to determine the metric based on an amplitude of the at least one unwanted signal portion and/or based on a phase of the at least one unwanted signal portion. Accordingly, the metric comprises information on an amplitude and/or a phase of the at least one unwanted signal portion.

In general, the amplitudes and/or phases of the at least one wanted signal portion and of the at least one unwanted signal portion are different from each other, such that the at least one unwanted signal portion may be identified based on an amplitude and/or phase comparison of different signal portions of the analysis signal.

In an embodiment, amplitudes of unwanted signal portions may be smaller than an amplitude of the at least one wanted signal portion, such that the unwanted signal portions can be identified based on their lower amplitude compared to the at least one wanted signal portion.

According to another aspect of the present disclosure, the signal analysis module, for example, includes circuitry configured to determine the metric based on a group delay of the at least one unwanted signal portion. Accordingly, the metric comprises information on a group delay of the at least one unwanted signal portion.

In general, as the at least one wanted signal portion and the at least one unwanted signal portion propagate though different signal paths, they have different group delays for arriving at the signal analysis module. Based on these different group delays, the signal analysis module can separate the at least one wanted signal portion from the at least one unwanted signal portion.

In an embodiment of the present disclosure, the signal analysis module is configured to remove the at least one unwanted signal portion from the analysis signal in order to determine the analysis data. In other words, the analysis data may be obtained based on a corrected analysis signal to that corresponds to the analysis signal with the at least one unwanted signal portion removed.

In an embodiment, the signal analysis module includes circuitry configured to remove the at least one unwanted signal portion from the analysis signal based on the determined metric.

A further aspect of the present disclosure provides that the signal analysis module, for example, includes circuitry configured to determine at least one complex-valued scaling factor based on the predetermined waveform and based on the identified at least one unwanted signal portion, and wherein the signal analysis module is configured to subtract the predetermined waveform scaled with the at least one complex-valued scaling factor from the analysis signal. Accordingly, the at least one unwanted signal portion is removed from the analysis signal at least partially, for example completely, by subtracting the predetermined waveform scaled with the at least one complex-valued scaling factor from the analysis signal.

In general, the complex-valued scaling factor comprises at least one amplitude factor and/or at least one phase factor. The at least one amplitude factor describes an amplitude of the at least one unwanted signal portion relative to the predefined waveform. The at least one phase factor describes a group delay of the at least one unwanted signal portion.

In an embodiment, the signal analysis module may include circuitry configured to determine the at least one complex-valued scaling factor based on the metric determined.

In an embodiment, the predetermined waveform scaled with the complex-values scaling factor may have the same or at least a similar shape as the modulated RF signal und thus as the at least one wanted signal portion, but a different amplitude and/or a different phase, i.e. a different group delay.

In an embodiment, the complex-valued scaling factor is determined by the signal analysis module such that the predetermined waveform scaled with the complex-valued scaling factor is equal to the at least one unwanted signal portion. Thus, it is ensured that by subtracting the predetermined waveform scaled with the at least one complex-valued scaling factor from the analysis signal, the at least one unwanted signal portion is removed from the analysis signal completely.

In an embodiment, the at least one amplitude factor of the at least one complex-valued scaling factor may be determined such that an amplitude of the predetermined waveform scaled with the at least one complex-valued scaling factor is equal to the amplitude of the at least one unwanted signal portion.

In an embodiment, the at least one amplitude factor may be determined based on the amplitude of the at least one unwanted signal portion.

In an embodiment, the at least one phase factor of the at least one complex-valued scaling factor may be determined such that a phase of the predetermined waveform scaled with the at least one complex-valued scaling factor is equal to the phase of the at least one unwanted signal portion. Thus, it is ensured that the predetermined waveform scaled with the at least one complex-valued scaling factor is subtracted from the analysis signal at the correct time, namely at the group delay of the at least one unwanted signal portion.

In an embodiment, the at least one phase factor may be determined based on a phase of the at least one unwanted signal portion, i.e. based on a group delay of the at least one unwanted signal portion.

In an embodiment, the predetermined waveform scaled with the complex-valued scaling factor may be equal to the spurious signal originating in the test and/or measurement system due to a signal leakage and/or due to an unwanted reflection.

In an embodiment, the signal analysis module may include circuitry configured to determine different complex-valued scaling factors for different unwanted signal portions. Thus, it is ensured that the different unwanted signal portions are all at least partially removed from the analysis signal, for example completely.

In an embodiment of the present disclosure, the signal analysis module is configured to iteratively determine the different complex-valued scaling factors and subtract the predetermined waveform scaled with the respective complex-valued scaling factor from the analysis signal. Thus, the different unwanted signal portions are iteratively removed from the analysis signal, thereby obtaining a corrected analysis signal that is free of the unwanted signal portions. In an embodiment, the corrected analysis signal may comprise only the at least one wanted signal portion.

In an embodiment, the signal analysis module may include circuitry configured to determine the analysis data based on the corrected analysis signal.

In an embodiment of the present disclosure, the analysis data comprises at least one scattering parameter of a device under test. For example, the at least one scattering parameter may describe a transmission of the device under test and/or a reflection at the device under test.

In an embodiment, the at least one scattering parameter may comprise an S11, S12, S21, and/or S22 parameter of the device under test.

In an embodiment, the test and/or measurement system may further comprise a first port, wherein the first port is connected to the signal generator module, and wherein the first port is connectable to a device under test, for example to an input of the device under test. Thus, the modulated RF signal may be forwarded to the device under test via the first port.

Of course, the first port may also be connected to a calibration standard for performing a calibration of the test and/or measurement system.

According to an aspect of the present disclosure, the signal analysis module, for example, is connected to the first port. In an embodiment, the signal analysis module may be connected to the first port via the at least one directive element described above.

Thus, a reflected signal that is reflected at the device under test or at a calibration standard may be received by the first port, and may be forwarded to the signal analysis module by the at least one directive element described above.

In an embodiment, the test and/or measurement system may further comprise a second port, wherein the second port is connected to a signal analysis module, and wherein the second port is connectable to the device under test, for example to an output of the device under test. Accordingly, the second port may be configured to receive an output signal of the device under test.

In an embodiment, the signal to be analyzed may be an output signal of the device under test corresponding to the modulated RF signal. In other words, the device under test may process the modulated RF signal, thereby obtaining the output signal and thus the signal to be analyzed.

Of course, the second port may also be connected to a calibration standard for performing a calibration of the test and/or measurement system, for example to a "through" calibration standard that is interconnected between the first port and the second port. In this case, the signal to be analyzed may be an output signal of the calibration standard corresponding to the modulated RF signal.

In an embodiment of the present disclosure, the test and/or measurement system further comprises a test and/or measurement instrument. The test and/or measurement instrument may comprise the signal generator module and/or the signal analysis module. In an embodiment, the test and/or measurement instrument is a vector network analyzer, a spectrum analyzer, a signal analyzer, or an oscilloscope. However, it is to be understood that the test and/or measurement instrument may be established as any other suitable type of test and/or measurement instrument.

Further, it is noted that the test and/or measurement instrument may comprise a first test and/or measurement instrument and a second test and/or measurement instrument, wherein the first test and/or measurement instrument comprises the signal generator module, and wherein second the test and/or measurement instrument comprises the signal analysis module.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
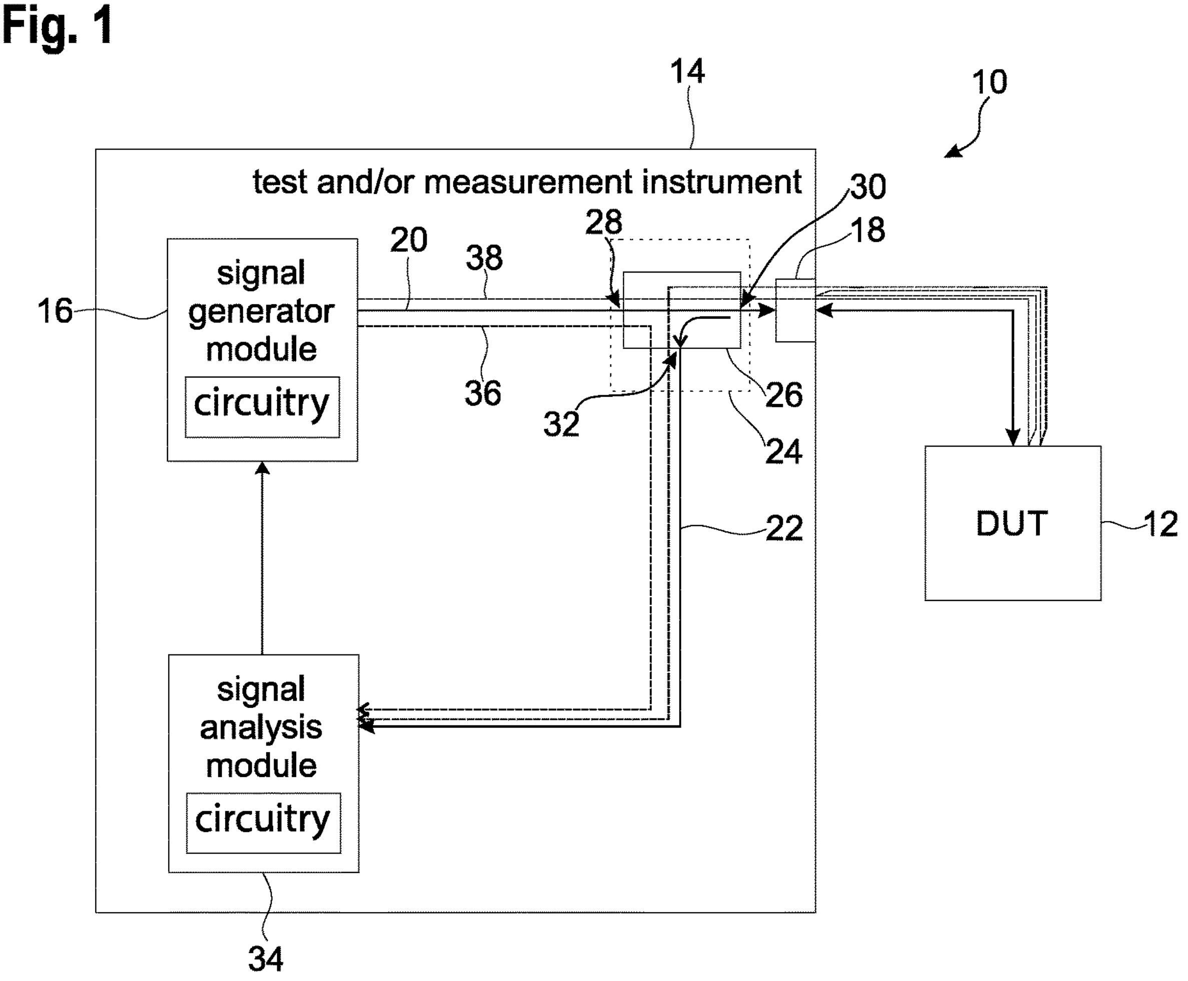
FIG. 1 schematically shows an example of a test and/or measurement system according to an embodiment of the present disclosure.

FIG. 1 schematically shows a test and/or measurement system 10 in accordance with an embodiment of the present disclosure. As shown in FIG. 1, the system 10 comprises a device under test 12 and a test and/or measurement instrument 14. The device under test 12 may be any type of electronic device that is configured to generate and/or process radio frequency (RF) signals.

In general, the test and/or measurement instrument 14 is configured to perform measurements on the device under test 12 in order to assess the performance of the device under test 12. For example, the test and/or measurement instrument 14 may be a vector network analyzer, an oscilloscope, a spectrum analyzer, or a signal analyzer. However, it is to be understood that the test and/or measurement instrument 14 may be established as any other suitable type of test and/or measurement instrument.

It is noted that the device under test 12 may be replaced by at least one calibration standard in order to perform a calibration of the test and/or measurement instrument 14. For example, a set of different reflection calibration standards, such as "open", "short", and "matched" (also called "load"), a comb generator generating a frequency comb, and/or a transmission calibration standard such as a "through" calibration standard connecting multiple ports of the test and/or measurement instrument 14 may be connected to the test and/or measurement instrument 14 consecutively.

Without restriction of generality, a measurement mode with the device under test 12 connected to the test and/or measurement instrument 14 is described hereinafter. However, it is to be understood that the explanations given hereinafter likewise apply to a calibration mode with at least one calibration standard connected to the test and/or measurement instrument 14.

Still referring to FIG. 1, the test and/or measurement instrument 14 comprises a signal generator module 16 that is connected to a first port 18 of the test and/or measurement instrument 14 by an output signal path 20. In general, the signal generator module 16 includes circuitry configured to generate a modulated RF signal based on a predetermined waveform, i.e. based on a digital waveform having known properties. In other words, the signal generator module 16 includes circuitry, for example, that is configured to convert the predetermined waveform being a digital signal into the modulated RF signal by playing back the predetermined waveform.

The device under test 12 is connected to the first port 18, such that the modulated RF signal generated by the signal generator module 16 is forwarded to the device under test 12 via the output signal path 20 and the first port 18. In an embodiment, an input of the device under test 12 is connected to the first port 18. For example, the device under test 12 may be connected to the first port 18 via a suitable cable.

The test and/or measurement instrument 14 further comprises a measurement signal path 22 that is coupled to the output signal path 20. For example, the measurement signal path 22 is coupled to the output signal path 20 by a first coupling module 24 comprising a directive element 26.

In the example embodiment shown in FIG. 1, the directive element 26 is a directional coupler. However, it is to be understood that the directive element 26 may, for example, also be a power combiner, a splitter, or a multiplexer.

The directive element 26 comprises a first port 28 that is connected to the signal generator module 16. The directive element 26 further comprises a second port 30 that is connected to the first port 18 of the test and/or measurement instrument 14, wherein the first port 28 and the second port 30 of the directive element 26 are connected by an electrical connection.

In an embodiment, the output signal path 20 extends through the directive element 26 from the first port 28 to the second port 30.

In the embodiment shown, the directive element 26 further comprises a third port 32 that is connected to the measurement signal path 22. The third port 32 is electromagnetically coupled to the output signal path 20, such that RF signals travelling from the first port 18 of the test and/or measurement instrument 14 towards the signal generator module 16 are coupled into the measurement signal path 22.

In an embodiment, the directive element 26 is configured to couple a reflected signal into the measurement signal path 22, wherein the reflected signal is the modulated RF signal reflected at the device under test 12. The reflected signal may be a signal to be analyzed.

Further, due to an imperfect directivity of the directive element 26, a portion of the modulated RF signal generated by the signal generator module 16 traveling towards the first port 18 of the test and/or measurement instrument 14 may be coupled into the measurement signal path 22 as well.

In the example embodiment of FIG. 1, the test and/or measurement instrument 14 further comprises a signal analysis module 34 that is connected to the measurement signal path 22 so as to receive an analysis signal. In general, the signal analysis module 34 includes circuitry configured to analyze the analysis signal, thereby obtaining analysis data.

In an embodiment, the analysis data comprises at least one scattering parameter of the device under test 12. In the example measurement setup shown in FIG. 1, the analysis data may comprise an S11 parameter of the device under test 12 or, if the first port 18 is connected to an output of the device under test 12, an S22 parameter of the device under test 12.

It is understood that the signal analysis module 34 may comprise all types of components that are necessary and/or suitable for performing the analysis, such as an analog-to-digital converter, a mixer, filters, amplifiers, attenuators, etc. However, in general the signal analysis module 34 may digitize the analysis signal and may perform subsequent analysis based on the digitized analysis signal.

As is indicated by the dashed arrows in FIG. 1, the analysis signal does not only comprise a signal to be analyzed, i.e. in the case of FIG. 1 the modulated RF signal reflected at the device under test 12, but also additional, spurious signals corresponding to unwanted signal portions of the analysis signal. In an embodiment, the analysis signal comprises a leaked signal 36 that corresponds to a portion of the modulated RF signal being leaked into the measurement signal path 22 due to the imperfect directivity of the directive element 26.

Further, the analysis signal may comprise at least one multi-reflection signal 38 that originates due to multiple reflections of the modulated RF signal. In the example shown in FIG. 1, the multi-reflection signal 38 originates from multiple reflections between the device under test 12 and the first port 18 of the test and/or measurement instrument 14.

However, it is to be understood that the explanations given hereinafter apply to all other types of leakages and/or multi-reflections as well, for example a reflection of the modulated RF signal at the device under test 12 back to the signal generator module 16, which may then be reflected at the signal generator module 16 and leaked in to the measurement signal path 22 by the directive element 26.

Without restriction of generality, the leaked signal 36 and the multi-reflection signal 38 are described hereinafter as being the unwanted signal portions.

Figure 2:
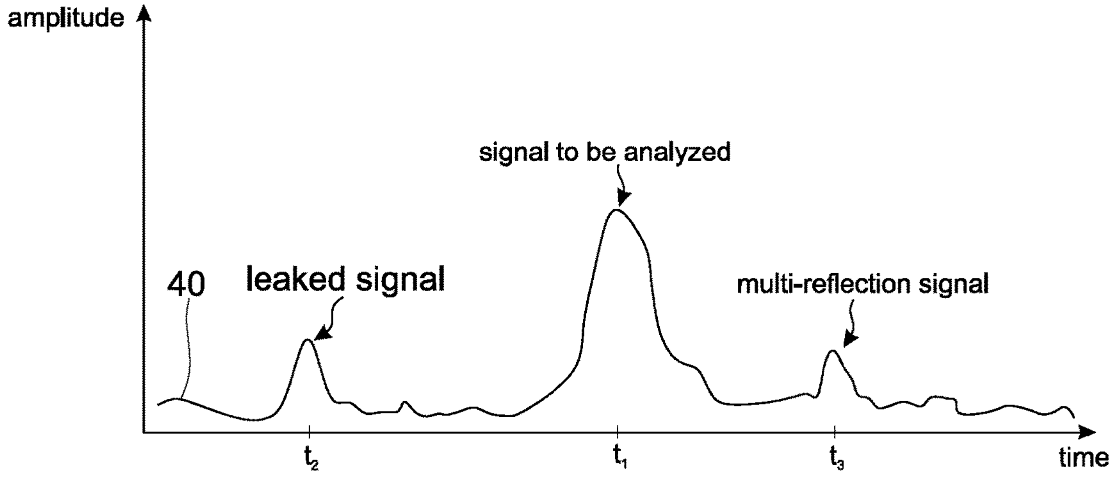
FIG. 2 schematically shows a representative diagram of an analysis signal plotted against time.

As is schematically illustrated in FIG. 2, which shows a plot 40 of the analysis signal over time, the signal to be analyzed (i.e. the modulated RF signal reflected at the device under test 12 once) has a first group delay t1 for reaching the signal analysis module 34.

The leaked signal 36 that is leaked by the directive element 26 has a second group delay t2 for reaching the signal analysis module 34, which is smaller than the first group delay t1. Further, an amplitude of the leaked signal 36 may be smaller than an amplitude of the signal to be analyzed.

The multi-reflection signal 38 has a third group delay t3 for reaching the signal analysis module 34, which is greater than the first group delay t1. Further, an amplitude of the multi-reflection signal 38 may be smaller than an amplitude of the signal to be analyzed.

In an embodiment, the signal analysis module 34 includes circuitry configured to determine the analysis data taking these types of spurious signals into account. In an embodiment, the signal analysis module 34 includes circuitry configured to determine a metric based on the analysis signal and based on the predetermined waveform, wherein the metric describes the unwanted signal portions, i.e. the leaked signal 36 and the multi-reflection signal 38.

Accordingly, the metric may be determined based on a priori knowledge about the predetermined waveform comprised in the at least one wanted signal portion and in the unwanted signal portions, respectively.

In general, the metric determined may describe the number of unwanted signal portions, a group delay of the respective unwanted signal portion(s), a phase of the respective unwanted signal portion(s), and/or an amplitude or a signal level of the respective unwanted signal portion(s). The determined metric may also describe the at least one wanted signal portion, i.e. the signal to be analyzed, for example a group delay, a phase, and/or an amplitude of the signal to be analyzed.

The unwanted signal portions may be identified based on the amplitude, phase, and/or group delay properties or differences of the unwanted signal portions compared to the wanted signal portion described above.

For example, the determined metric may be or comprise an impulse response of the test and/or measurement system 10. In an embodiment, the determined metric may be or comprise an impulse response of a portion of the test and/or measurement system 10 between the signal generator module 16 and the signal analysis module 34. In an embodiment, the metric may be or comprise impulse responses of the individual signal paths travelled by the spurious signals, and optionally by the signal to be analyzed.

In an embodiment, the signal analysis module 34 may include circuitry configured to remove the at least one unwanted signal portion from the analysis signal based on the determined metric. For example, the signal analysis module 34 may be configured to determine at least one respective complex-valued scaling factor for the unwanted signal portions based on the determined metric, i.e. based on the predetermined waveform and based on the identified unwanted signal portions.

Each complex-valued scaling factor determined may comprise at least one amplitude factor and/or at least one phase factor. The at least one amplitude factor describes an amplitude of the respective unwanted signal portion relative to the predefined waveform. The at least one phase factor describes a group delay of the respective unwanted signal portion.

The complex-valued scaling factors are determined by the signal analysis module 34 such that the predetermined waveform scaled with the respective at least one complex-valued scaling factor is equal to the respective unwanted signal portion.

In an embodiment, the at least one amplitude factor of the at least one complex-valued scaling factor may be determined such that an amplitude of the predetermined waveform scaled with the at least one complex-valued scaling factor is equal to the amplitude of the at least one unwanted signal portion. In an embodiment, the at least one amplitude factor may be determined based on the amplitude of the at least one unwanted signal portion.

In an embodiment, the at least one phase factor of the at least one complex-valued scaling factor may be determined such that a phase of the predetermined waveform scaled with the at least one complex-valued scaling factor is equal to the phase of the at least one unwanted signal portion. Thus, it is ensured that the predetermined waveform scaled with the at least one complex-valued scaling factor is subtracted from the analysis signal at the correct time, namely at the group delay of the at least one unwanted signal portion.

In an embodiment, the at least one phase factor may be determined based on a phase of the at least one unwanted signal portion, i.e. based on a group delay of the at least one unwanted signal portion.

In an embodiment, the signal analysis module 34 may include circuitry configured to subtract the predetermined waveform scaled with the respective at least one complex-valued scaling factor from the analysis signal, such that the respective unwanted signal portion is removed from the analysis signal.

In an embodiment, the signal analysis module 34 may include circuitry configured to iteratively determine the different complex-valued scaling factors for the different unwanted signal portions, and subtract the predetermined waveform scaled with the respective complex-valued scaling factor from the analysis signal.

Thus, the different unwanted signal portions are iteratively removed from the analysis signal, thereby obtaining a corrected analysis signal that is free of the unwanted signal portions. For example, the signal analysis module 34 may include circuitry that first removes the unwanted signal portion having the highest amplitude, then the unwanted signal portion having the second-highest amplitude, etc. However, any other suitable order of removing the unwanted signal portions may be used.

In an embodiment, the signal analysis module 34 may include circuitry configured to determine the analysis data described above based on the corrected analysis signal.

Accordingly, the measurement results obtained, for example the scattering parameter(s) of the device under test 12, are free of influence from the spurious signals, i.e. free of influence of the unwanted signal portions.

It is noted that the signal analysis module 34 may include circuitry configured to generate the predetermined waveform and/or to receive the predetermined waveform, e.g. via suitable user interface. The signal analysis module 34 may also include circuitry configured to transmit the predetermined waveform to the signal generator module 16 via a suitable data connection.

Figure 3:
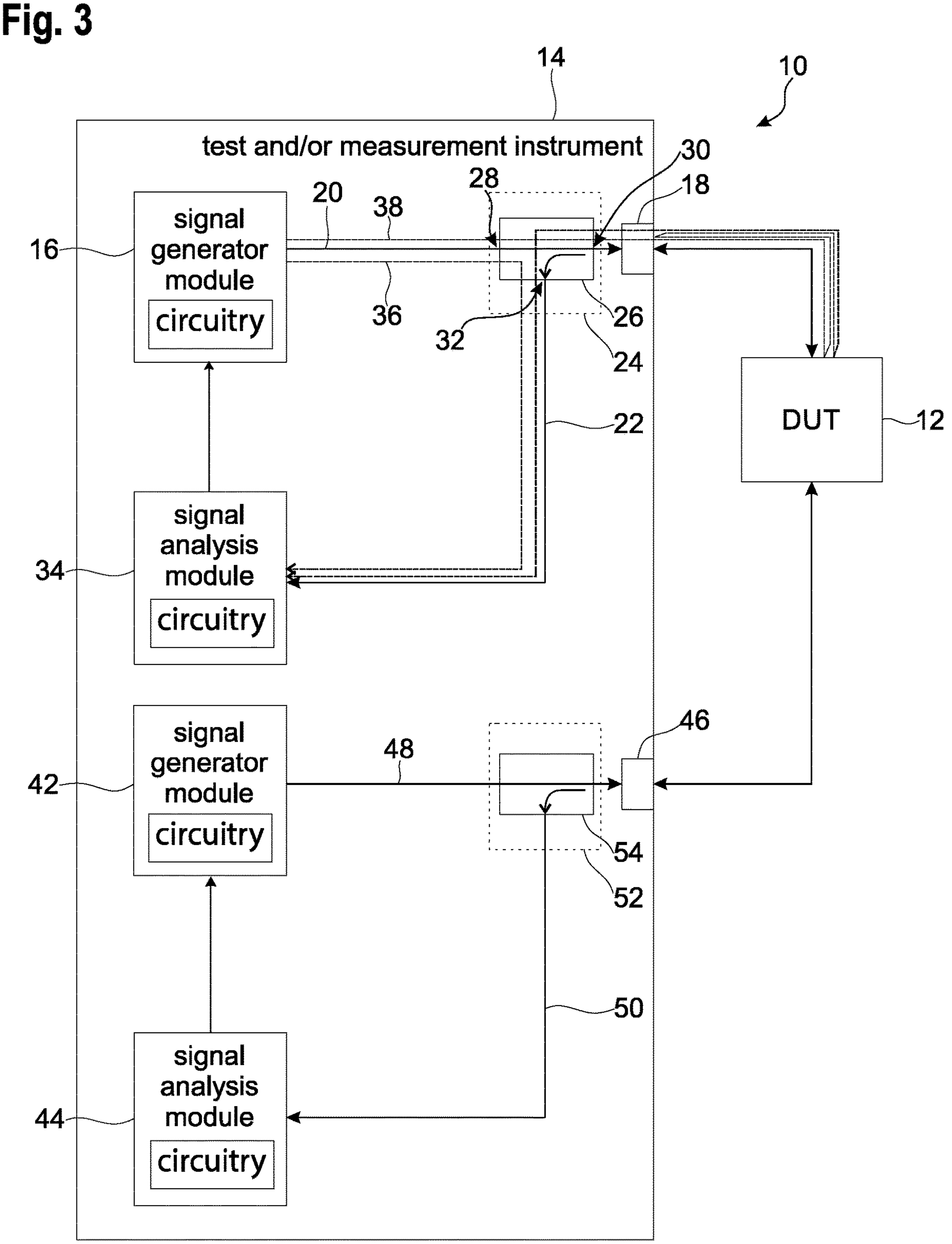
FIG. 3 schematically shows an example of a test and/or measurement system according to another embodiment of the present disclosure.

FIG. 3 shows another embodiment of the test and/or measurement system 10, wherein only the differences compared to the embodiment of FIG. 1 described above are explained hereinafter. In this example embodiment, the test and/or measurement instrument 14 may be a vector network analyzer.

As shown in FIG. 3, the test and/or measurement instrument 14 further comprises a signal generator module 42 and a signal analysis module 44. It is to be understood that the signal generator module 16 and the further signal generator module 42 may be partially or completely integrated into the same module. Likewise, the signal analysis module 34 and the further signal analysis module 44 may be partially or completely integrated into the same module.

The test and/or measurement instrument 14 further comprises a second port 46 that is connected to the device under test 12, for example to an output of the device under test 12. The second port 46 further is connected to the signal generator module 42 by an output signal path 48.

The test and/or measurement instrument 14 further comprises a measurement signal path 50 that is coupled to the output signal path 48 by a coupling module 52, for example by a directive element 54, analogously to the measurement signal path 22 described above. In the example embodiment shown in FIG. 3, the directive element 54 is a directional coupler. However, it is to be understood that the directive element 54 may, for example, also be a power combiner, a splitter, or a multiplexer. Analogously to the signal analysis module 34 described above, the signal analysis module 44 includes circuitry configured to receive an analysis signal via the measurement signal path 50.

In an embodiment, the signal analysis module 44 includes circuitry configured to determine analysis data based on the analysis signal, wherein the signal analysis module 44 is configured to take unwanted signal portions corresponding to signal leakages and/or unwanted reflections into account for determining the analysis signal.

Regarding the analysis of the analysis signal, the explanations given above with respect to the signal analysis module 34 likewise apply to the further signal analysis module 44. Thus, the signal analysis module 34 and the signal analysis module 44 each and/or together may obtain analysis data that is corrected for unwanted signal leakages and/or unwanted reflections originating in the test and/or measurement system 10.

In the example embodiment of FIG. 3, the analysis data may comprise scattering parameters of the device under test 12, for example an S11, S12, S21, and/or S22 parameter of the device under test 12.

It is noted that, in another embodiment, the signal generator module 42, and the coupling module 52 may be omitted. The second port 46 may be connected to the signal analysis module 34 via the measurement signal path 50 directly.

Certain embodiments disclosed herein include systems, apparatus, modules, units, devices, components, etc., that utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

For example, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implementing the functionality described herein.

Of course, in an embodiment, two or more of these components, or parts thereof, can be integrated or share hardware and/or software, circuitry, etc. In an embodiment, these components, or parts thereof, may be grouped in a single location or distributed over a wide area. In circumstances where the components are distributed, the components are accessible to each other via communication links.

In an embodiment, one or more of the components of the device under test 12, the test and/or measurement instrument 14, etc., referenced above include circuitry programmed to carry out one or more functions of the devices disclosed herein. In an embodiment, one or more computer-readable media associated with or accessible by such circuitry contains computer readable instructions embodied thereon that, when executed by such circuitry, cause the component or circuity to carry out the function(s) of the devices disclosed herein.

In an embodiment, the computer readable instructions includes applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably).

In an embodiment, computer-readable media is any medium that stores computer readable instructions, or other information non-transitorily and is directly or indirectly accessible to a computing device, such as processor circuitry, etc., or other circuitry disclosed herein etc. In other words, a computer-readable medium is a non-transitory memory at which one or more computing devices can access instructions, codes, data, or other information. As a non-limiting example, a computer-readable medium may include a volatile random access memory (RAM), a persistent data store such as a hard disk drive or a solid-state drive, or a combination thereof. In an embodiment, memory can be integrated with a processor, separate from a processor, or external to a computing system.

Accordingly, blocks of the block diagrams and/or flowchart illustrations support various combinations for performing the specified functions, combinations of operations for performing the specified functions and program instructions for performing the specified functions. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the functionality described herein. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure.

In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. In addition, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Thus, it will be appreciated that embodiments of the present disclosure may employ any combination of features described herein. All such combinations or sub-combinations of features are within the scope of the present disclosure.

Throughout this specification, terms of art may be used. These terms are to take on their ordinary meaning in the art from which they come, unless specifically defined herein or the context of their use would clearly suggest otherwise.

The drawings in the FIGURES are not to scale. Similar elements are generally denoted by similar references in the FIGURES. For the purposes of this disclosure, the same or similar elements may bear the same references. Furthermore, the presence of reference numbers or letters in the drawings cannot be considered limiting, even when such numbers or letters are indicated in the claims.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the disclosure in which an exclusive property or privilege is claimed are defined as follows:

1. A test and/or measurement system, the test and/or measurement system comprising:

- a signal generator module, wherein the signal generator module includes circuitry configured to generate a modulated radio frequency (RF) signal based on a predetermined waveform, and
- a signal analysis module, wherein the signal analysis module includes circuitry configured to receive an analysis signal via at least one signal path, wherein the analysis signal corresponds to the modulated RF signal, wherein the analysis signal comprises at least one wanted signal portion, wherein the at least one wanted signal portion is a portion of the analysis signal to be analyzed, wherein the analysis signal further comprises at least one unwanted signal portion, wherein the at least one unwanted signal portion corresponds to a spurious signal originating in the test and/or measurement system due to signal leakage and/or due to reflections, wherein the signal analysis module includes circuitry configured to:

identify the at least one unwanted signal portion in the analysis signal based on the predetermined waveform, and analyze the analysis signal taking the identified at least one unwanted signal portion into account, thereby obtaining analysis data, and determine a metric based on the analysis signal and based on the predetermined waveform, wherein the metric describes the at least one unwanted signal portion.

2. The test and/or measurement system of claim 1, further comprising at least one directive element, wherein the at least one unwanted signal portion comprises a leaked signal that is leaked by the at least one directive element.

3. The test and/or measurement system of claim 1, wherein the signal analysis module includes circuitry configured to determine the metric based on an amplitude of the at least one unwanted signal portion and/or based on a phase of the at least one unwanted signal portion.

4. The test and/or measurement system of claim 1, wherein the signal analysis module includes circuitry configured to determine the metric based on a group delay of the at least one unwanted signal portion.

5. The test and/or measurement system according to claim 1, wherein the signal analysis module includes circuitry configured to remove the at least one unwanted signal portion from the analysis signal in order to determine the analysis data.

6. The test and/or measurement system according to claim 1, wherein the analysis data comprises at least one scattering parameter of a device under test.

7. The test and/or measurement system according to claim 1, further comprising a first port connected to the signal generator module, wherein the first port is connectable to a device under test.

8. The test and/or measurement system of claim 7, wherein the signal analysis module is connected to the first port.

9. The test and/or measurement system of claim 7, further comprising a second port connected to a signal analysis module, wherein the second port is connectable to the device under test.

10. The test and/or measurement system according to claim 1, further comprising a test and/or measurement instrument, wherein the test and/or measurement instrument comprises the signal generator module and/or the signal analysis module.

11. The test and/or measurement system according to claim 10, wherein the test and/or measurement instrument is a vector network analyzer, a spectrum analyzer, a signal analyzer, or an oscilloscope.

12. A test and/or measurement system, the test and/or measurement system comprising a signal generator module, wherein the signal generator module includes circuitry configured to generate a modulated radio frequency (RF) signal based on a predetermined waveform, and a signal analysis module, wherein the signal analysis module includes circuitry configured to receive an analysis signal via at least one signal path, wherein the analysis signal corresponds to the modulated RF signal, wherein the analysis signal comprises at least one wanted signal portion, wherein the at least one wanted signal portion is a portion of the analysis signal to be analyzed, wherein the analysis signal further comprises at least one unwanted signal portion, wherein the at least one unwanted signal portion corresponds to a spurious signal originating in the test and/or measurement system due to signal leakage and/or due to reflections, wherein the signal analysis module includes circuitry configured to:

identify the at least one unwanted signal portion in the analysis signal based on the predetermined waveform, and analyze the analysis signal taking the identified at least one unwanted signal portion into account, thereby obtaining analysis data, wherein the signal analysis module includes circuitry configured to determine at least one complex-valued scaling factor based on the predetermined waveform and based on the identified at least one unwanted signal portion, and wherein the signal analysis module includes circuitry configured to subtract the predetermined waveform scaled with the at least one complex-valued scaling factor from the analysis signal.

13. The test and/or measurement system of claim 12, wherein the complex-valued scaling factor is determined by the signal analysis module such that the predetermined waveform scaled with the complex-valued scaling factor is equal to the at least one unwanted signal portion.

14. The test and/or measurement system according to claim 12, wherein the signal analysis module includes circuitry configured to determine different complex-valued scaling factors for different unwanted signal portions.

15. The test and/or measurement system according to claim 14, wherein the signal analysis module includes circuitry configured to iteratively determine the different complex-valued scaling factors and subtract the predetermined waveform scaled with the respective complex-valued scaling factor from the analysis signal.

* * * * *